(12) United States Patent
Makino

(10) Patent No.: US 8,878,059 B2
(45) Date of Patent: Nov. 4, 2014

(54) WATERPROOF BOX AND ELECTRICAL JUNCTION BOX HAVING THE SAME

(75) Inventor: Kimitoshi Makino, Makinohara (JP)

(73) Assignee: Yazaki Corporation, Tokyo (JP)

( * ) Notice: Subject to any disclaimer, the term of this patent is extended or adjusted under 35 U.S.C. 154(b) by 225 days.

(21) Appl. No.: 13/551,757

(22) Filed: Jul. 18, 2012

(65) Prior Publication Data
US 2013/0032371 A1 Feb. 7, 2013

(30) Foreign Application Priority Data
Aug. 2, 2011 (JP) .................. 2011-169422

(51) Int. Cl.
| | |
|---|---|
| *H02G 3/14* | (2006.01) |
| *H02G 3/08* | (2006.01) |
| *B60R 16/023* | (2006.01) |
| *H05K 7/02* | (2006.01) |
| *H05K 5/06* | (2006.01) |

(52) U.S. Cl.
CPC ............ *H02G 3/088* (2013.01); *B60R 16/0238* (2013.01); *H05K 7/026* (2013.01); *H05K 5/063* (2013.01)
USPC ........................................... 174/50; 220/200

(58) Field of Classification Search
CPC ........... H02G 3/14; H02G 3/08; H02G 3/088; H02G 3/081; H02G 3/086; H05K 5/063; H05K 5/069
USPC ............................................ 174/50; 220/200
See application file for complete search history.

(56) References Cited

U.S. PATENT DOCUMENTS

2010/0127012 A1    5/2010    Takeuchi et al.

FOREIGN PATENT DOCUMENTS

JP          2010-130705 A       6/2010

*Primary Examiner* — Timothy Thompson
*Assistant Examiner* — Charles Pizzuto
(74) *Attorney, Agent, or Firm* — Edwards Wildman Palmer LLP

(57) ABSTRACT

The waterproof box includes a body case and a cover mounted to the body case by making a hook portion at one end of the cover engaged with a projection at one end of the body case and rotatably moving the cover around the hook portion. The one end of the respective body case and the cover has a double-walled structure having an outer wall and an inner wall. With the cover mounted to the body case, the outer wall of the body case is located inside the outer wall of the cover, the inner wall of the cover is located inside the outer wall of the body case, the inner wall of the body case is located inside the inner wall of the cover, and the outer wall of the body case and the inner wall of the cover are arranged with a space between each other.

8 Claims, 9 Drawing Sheets

WATERPROOF BOX AND ELECTRICAL JUNCTION BOX HAVING THE SAME

This application is on the basis of Japanese Patent Application No. 2011-169422, the contents of which are hereby incorporated by reference.

TECHNICAL FIELD

The present invention relates to a waterproof box used for example in an electrical junction box mounted to a motor vehicle.

BACKGROUND ART

A motor vehicle is mounted with various electronic equipments. An electrical junction box is provided at a suitable location in the motor vehicle to supply electricity and transmit signals to those electronic equipments mounted in the motor vehicle. The term "electrical junction box" used herein collectively means a junction block or box, a fuse block or box and a relay block or box.

This electrical junction box utilizes a waterproof box for preventing water from entering inside the electrical junction box during driving in the rain or during car washing. FIG. 9 shows a cross-sectional perspective view of a conventional waterproof box used in a conventional electrical junction box (refer for example to Japan Patent Application Publication No. 2010-130705).

A conventional waterproof box 201 shown in FIG. 9 includes a body case 203 and a cover 202 mounted to the body case 203 so as to cover an opening of the body case 203. The body case 203 includes a rectangular frame-like peripheral wall 230. The cover 202 includes a rectangular upper wall 223 and a rectangular frame-like peripheral wall 220 extending perpendicularly from an outer periphery of the upper wall 223. This peripheral wall 220 is provided with a water proof groove portion 204 formed at a tip end of the peripheral wall 220 into which a tip end of the peripheral wall 230 of the body case 203 is inserted. This waterproof groove portion 204 is composed of an outer wall 221 positioned outside of the tip end of the peripheral wall 230 and an inner wall 222 positioned inside of the tip end of the peripheral wall 230.

In such manner, with the tip end of the peripheral wall 230 of the body case 203 inserted into the waterproof groove portion 204 of the cover 202, the waterproof box 201 prevents water from entering inside from between the body case 203 and the cover 202 without using a packing.

Furthermore, although it is not shown in FIG. 9, the waterproof box 201 includes an engagement portion formed at one end 202a of the cover 202, and an engagement mating portion formed at one end 203a of the body case 203 with which the engagement portion is engaged. Furthermore, there is provided a lock portion formed at the other end 202b of the cover 202 and a lock receiving portion formed at the other end 203b of the body case 203 and at which the lock portion is locked. When mounting the cover 202 to the body case 203, firstly the engagement portion of the cover 202 is engaged with the engagement mating portion of the body case 203, followed by rotatably moving the cover 202 around the engagement portion as a rotation center and make the lock portion locked at the lock receiving portion, thereby mounting the cover 202 to the body case 203.

In the above-described waterproof box 201, the length of the inner wall 222 adjacent to the one end 202a is formed shorter than the length of the inner wall 222 adjacent to the other end 202b in order to prevent the inner wall 222 of the waterproof groove portion 204 from hitting on the peripheral wall 230 of the body case 203 when rotatably moving the cover 202 around the engagement portion.

The electrical junction box having the waterproof box 201 described above has following drawback. That is, depending on a mounting situation of the electrical junction box on the motor vehicle, water may forcefully splatter onto the cover 202 adjacent to the one end 202a, and in this case, the length of the inner wall 222 adjacent to the one end 202a is not sufficient to prevent water from entering into the waterproof box.

SUMMARY OF INVENTION

In view of the above-described drawback, it is an object of the present invention to provide a waterproof box having improved waterproof property without using a packing, as well as to provide an electrical junction box having the waterproof box with improved waterproof property.

In order to achieve the above-described object, the present invention provides, according to a first aspect, a waterproof box having a body case and a cover mounted to the body case so as to cover an opening of the body case, wherein the cover is mounted to the body case by firstly making an engagement portion located at one end of the cover engaged with an engagement mating portion located at one end of the body case and then rotatably moving the cover around the engagement portion so that the cover is mounted to the body case, wherein each of the one end of the body case and the one end of the cover has a double-walled structure composed of an outer wall and an inner wall, and wherein with the cover mounted to the body case, the outer wall of the body case is located on inner side of the outer wall of the cover, the inner wall of the cover is located on inner side of the outer wall of the body case, the inner wall of the body case is located on inner side of the inner wall of the cover, and the outer wall of the body case and the inner wall of the cover are arranged with a space between each other.

Furthermore, according to a second aspect of the present invention, the waterproof box described above may further include a protrusion formed on an inner wall of the body case, the protrusion being arranged such that a tip end of the inner wall of the cover abuts on the protrusion.

Furthermore, according to a third aspect of the present invention, at least a portion of the inner wall of the cover may be arranged in contact with or adjacent to the inner wall of the body case in an overlapped fashion.

Furthermore, according to a fourth aspect of the present invention, there is provided an electrical junction box having the waterproof box according to any one of the first to third aspects described above.

According to the first aspect of the present invention described above, each of the one end of the body case and the one end of the cover has a double-walled structure composed of an outer wall and an inner wall, and with the cover mounted to the body case, the outer wall of the body case is located on inner side of the outer wall of the cover, the inner wall of the cover is located on inner side of the outer wall of the body case, the inner wall of the body case is located on inner side of the inner wall of the cover, and the outer wall of the body case and the inner wall of the cover are arranged with a space between each other. Consequently, there is provided a sufficient distance between the engagement portion as a rotation center and the inner wall of the cover. Thus, even with the inner wall of the cover being long, it is possible to prevent the inner wall of the cover hitting on the outer wall of the body case during the rotatable movement of the cover. Furthermore, when water has entered into a space between the outer wall of the body case and the inner wall of the cover, the inner wall of the body case located further inside can stop the water. Thus, a waterproof box having improved waterproof property can be provided without using a packing.

According to the second aspect of the present invention described above, the protrusion provided at the inner wall of the body case can prevent water from entering in to a space between the inner wall of the body case and the inner wall of the cover, thereby further improving the waterproof property of the waterproof box.

According to the third aspect of the present invention described above, at least a portion of the inner wall of the cover is arranged in contact with or adjacent to the inner wall of the body case in an overlapped fashion. Consequently, it is able to prevent water from entering into a space between the inner wall of the body case and the inner wall of the cover, thereby further improving the waterproof property of the waterproof box.

According to the fourth aspect of the present invention described above, an electrical junction box having improved waterproof property can be provided at low cost by employing the waterproof box according to any one of the first to third aspects described above.

DESCRIPTION OF EXEMPLARY EMBODIMENTS

First Exemplary Embodiment

In the following, an electrical junction box having a waterproof box according to a first exemplary embodiment of the present invention is explained in reference with FIGS. 1 through 7. The electrical junction box 10 according to the present invention may be mounted to a motor vehicle for supplying electricity and transmitting signals to various electronic equipments mounted in the motor vehicle.

Figure 1:
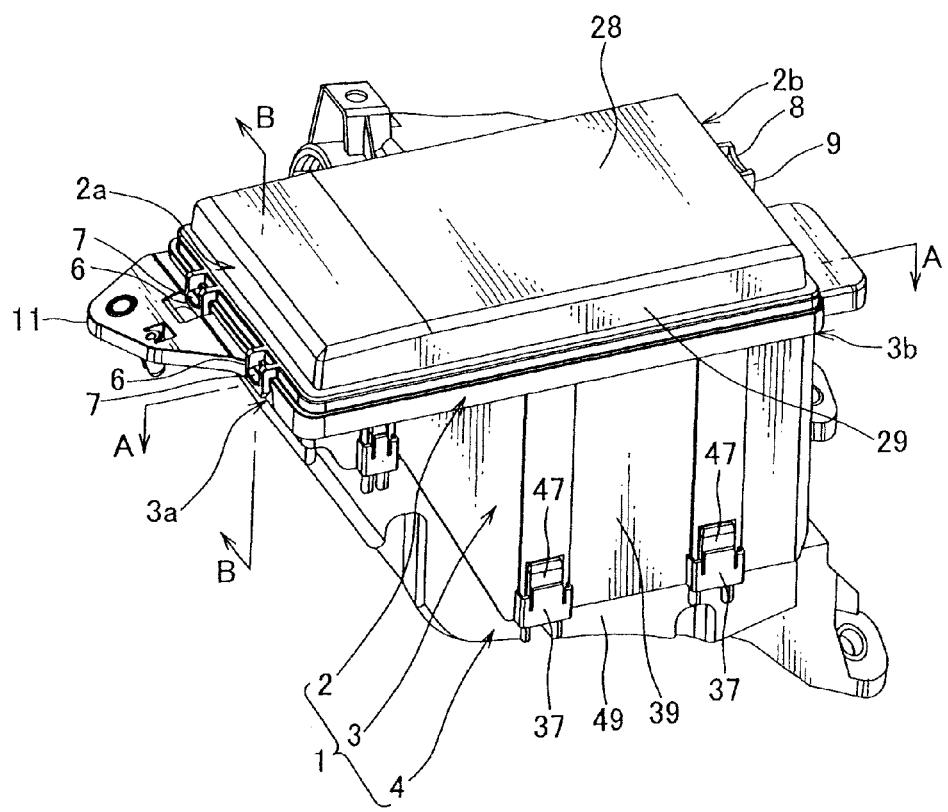
FIG. 1 is a perspective view of an electrical junction box having a waterproof box according to a first exemplary embodiment of the present invention.
Figure 2:
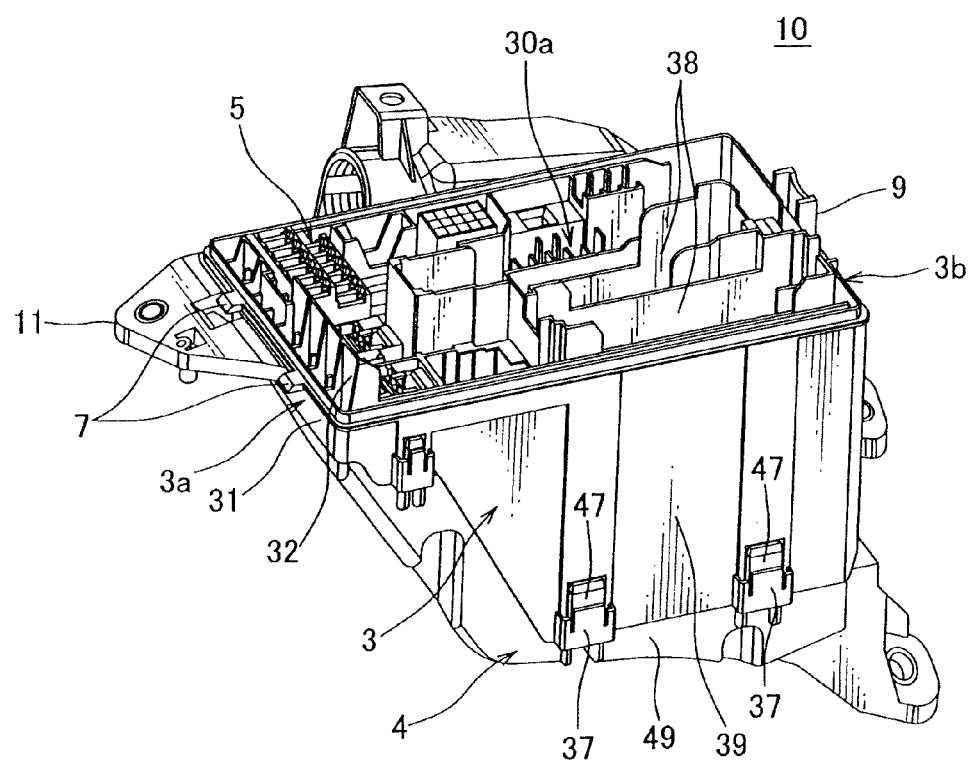
FIG. 2 is a perspective view showing a body case of the waterproof box shown in FIG. 1 with an upper cover being removed.

As shown in FIGS. 1 and 2, the electrical junction box 10 may include a waterproof box 1, a cassette block 5 made of synthetic resin and mounted in the waterproof box 1 and a plurality of electronic components mounted to the cassette block 5.

The waterproof box 1 may include a body case 3, an upper cover 2 (corresponds to a cover described in claims) mounted to the body case 3 so as to cover an upper opening 30a of the body case 3, and a lower cover 4 mounted to the body case 3 so as to cover a lower opening 30b of the body case 3. Each of the body case 3, the upper cover 2 and the lower cover 4 may be made of insulating synthetic resin and formed by well-known injection molding.

The body case 3 may include a frame-like peripheral wall 39 having an upper opening 30a at an upper face and a lower opening 30b at a lower face, a partition wall 38 (refer to FIG. 2) which divides a space inside of the peripheral wall 39, a bracket 11 extending from one end 3a of the peripheral wall 39 and arranged to be fixed using a bolt to a vehicle body panel and such, a pair of plate-like projections 7 projecting from the one end 3a of the peripheral wall 39, a lock receiving portion 9 provided at the other end 3b of the peripheral wall 39 at which a lock portion 8 of the upper cover 2 is locked, and a lock receiving portion 37 provided at an outer face of the peripheral wall 39 at which a lock portion 47 of the lower cover 4 is locked.

Figure 4:
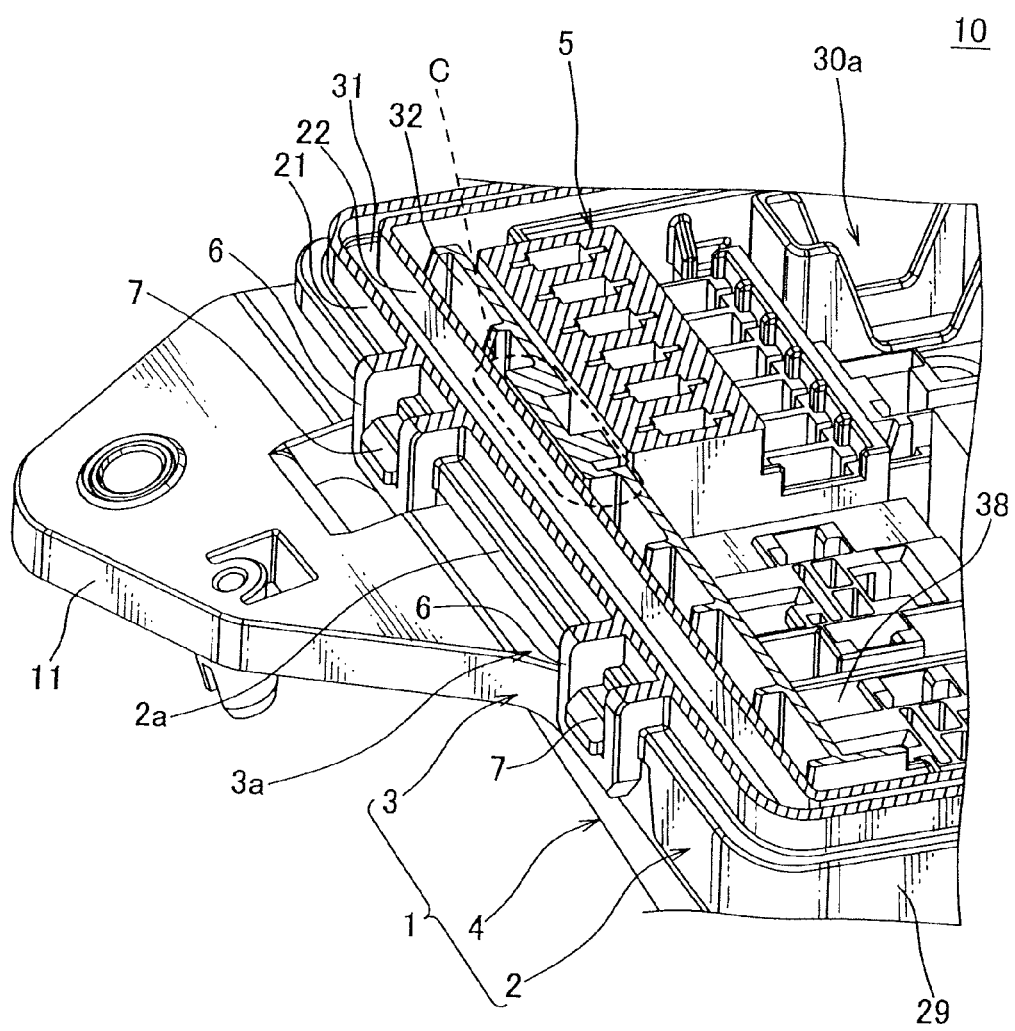
FIG. 4 is a cross-sectional view taken along a line A-A shown in FIG. 1.

The upper cover 2 may include a rectangular upper wall 28, a rectangular frame-like peripheral wall 29 extending perpendicularly from an outer periphery of the upper wall 28, a pair of hook portions 6 (corresponds to an engagement portion described in claims) extending from one end 2a of the peripheral wall 29 and arranged to engage with the projection 7 (corresponds to an engagement mating portion described in claims), and the lock portion 8 arranged at the other end 2b of the peripheral wall 29. As shown in FIG. 4, the hook portion 6 extends from an outer surface of the peripheral wall 29 and is formed into a frame-like shape so that the projection 7 can be positioned inside the hook portion 6. More specifically, the hook portion 6 extends from the outer surface of the peripheral wall 29 in a direction perpendicular to the outer surface of the peripheral wall 29, bends at a right angle in the middle and extends parallel to the outer surface of the peripheral wall 29.

Figure 5:
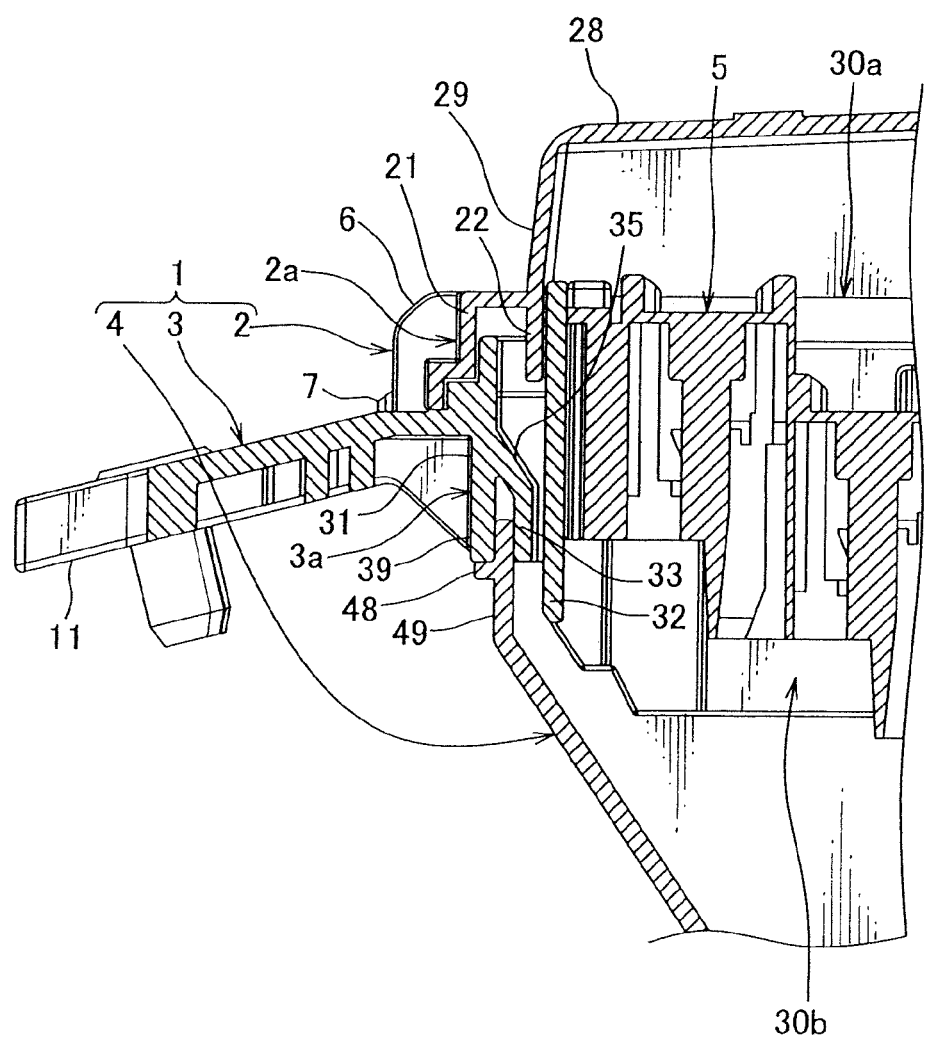
FIG. 5 is a cross-sectional view taken along a line B-B shown in FIG. 1.

As shown in FIG. 5, the lower cover 4 may include a bottom wall, a peripheral wall 49, a protrusion 48 projecting from an outer surface of the peripheral wall 49 and the lock portion 47 arranged at the outer surface of the peripheral wall 49.

Figure 6:
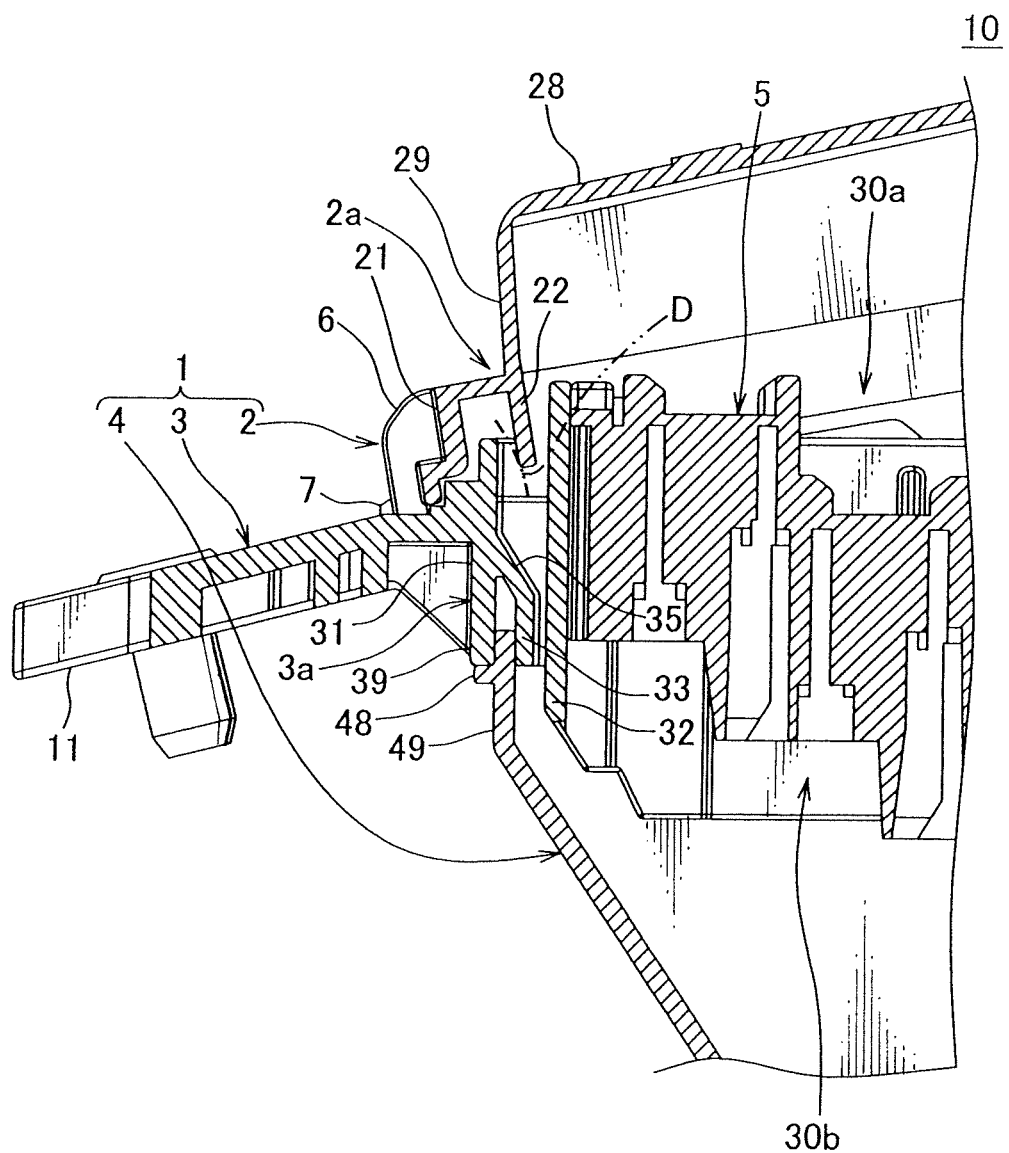
FIG. 6 is an explanatory view for explaining a method of mounting an upper cover of FIG. 5 to the body case.

When mounting the upper cover 2 to the body case 3 as shown in FIG. 6, firstly the hook portion 6 formed at the one end 2a of the upper cover 2 is engaged with or fitted to the projection 7 formed at the one end 3a of the body case 3. Then, the upper cover 2 is rotatably moved around the hook portion 6 as a rotation center, and the lock portion 8 formed at the other end 2b of the upper cover 2 is pushed into the lock receiving portion 9 formed at the other end 3b of the body case 3, thereby mounting the upper cover 2 to the body case 3.

When mounting the lower cover 4 to the body case 3, the lower cover 4 and the body case 3 are moved towards each other along a depth direction of the body case 3, followed by pushing the lock portion 47 of the lower cover 4 into the lock receiving portion 37 of the body case 3, thereby mounting the lower cover 4 to the body case 3.

Next, a waterproof structure of the waterproof box 1 is explained.

In order to improve the waterproof property of the waterproof box 1, the peripheral wall 39 of the body case 3 may have, across the entire circumference, a double-walled structure composed of an outer wall 31 and an inner wall 32. Similarly, the peripheral wall 29 of the upper cover 2 may also have a double-walled structure composed of an outer wall 21 and an inner wall 22 across the entire circumference. Under a situation where the upper cover 2 is mounted to the body case 3, the outer wall 31 of the body case 3 is located on the inner side of the outer wall 21 of the upper cover 2, the inner wall 22 of the upper cover 2 is located on the inner side of the outer wall 31 of the body case 3, the inner wall 32 of the body case 3 is located on the inner side of the inner wall 22 of the upper cover 2, and the outer wall 31 of the body case 3 and the inner wall 22 of the upper cover 2 are arranged with a space between each other. The length of the inner wall 22 of the upper cover 2 adjacent to the one end 2a may be formed equal to the length of the inner wall 22 of the upper cover 2 adjacent to the other end 2b. Furthermore, a tip end of the outer wall 21 of the upper cover 2 and an upper end of the outer wall 31 of the body case 3 may be formed into a stepped shape which abuts on or fits with respect to each other.

As described herein, in the present invention, the peripheral wall 29, 39 may have a double-walled structure across the entire circumference. However, in an alternative embodiment, only one of the one end 3a of the body case 3 and the one end 2a of the upper cover 2 may have a double-walled structure. That is, in the present invention, at least one of the one end 3a of the body case 3 and the one end 2a of the upper cover 2 may have a double-walled structure.

As described above, the upper cover 2 is mounted to the body case 3 by rotatably moving the upper cover 2 around the hook portion 6 as a rotation center. In order to prevent the inner wall 22 of the upper cover 2 adjacent to the one end 2a from hitting on the outer wall 31 of the body case 3 during the rotatable movement of the upper cover, the space between the outer wall 21 and the inner wall 22 of the upper cover 2 adjacent to the one end 2a may be formed larger than the space between the outer wall 21 and the inner wall 22 of the upper cover 2 adjacent to the other end 2b. Referring to FIG. 6, the dotted line D shows a trajectory of the rotatable movement of a tip end of the inner wall 22 of the upper cover 2. That is, in the present invention, in order to ensure a sufficient length of the inner wall 22 adjacent to the one end 2a which is adjacent to the rotation center to improve waterproof property, the space between the outer wall 21 and the inner wall 22 adjacent to the one end 2a is formed large, so that the inner wall 22 is distanced from the hook portion 6 (the rotation center). In such manner, by providing the inner wall 22 having the sufficient length, the flow of water entered from between the outer wall 21 of the upper cover 2 and the outer wall 31 of the body case 3 can be direct in a downward direction. Furthermore, if, by any chance, water has entered into the space between the outer wall 31 of the body case 3 and the inner wall 22 of the upper cover 2, the inner wall 32 of the body case 3 which is provided further inside of the body case 3 can prevent the water from entering deeper inside. Consequently, the electronic components can be protected from being affected by water.

Figure 3:
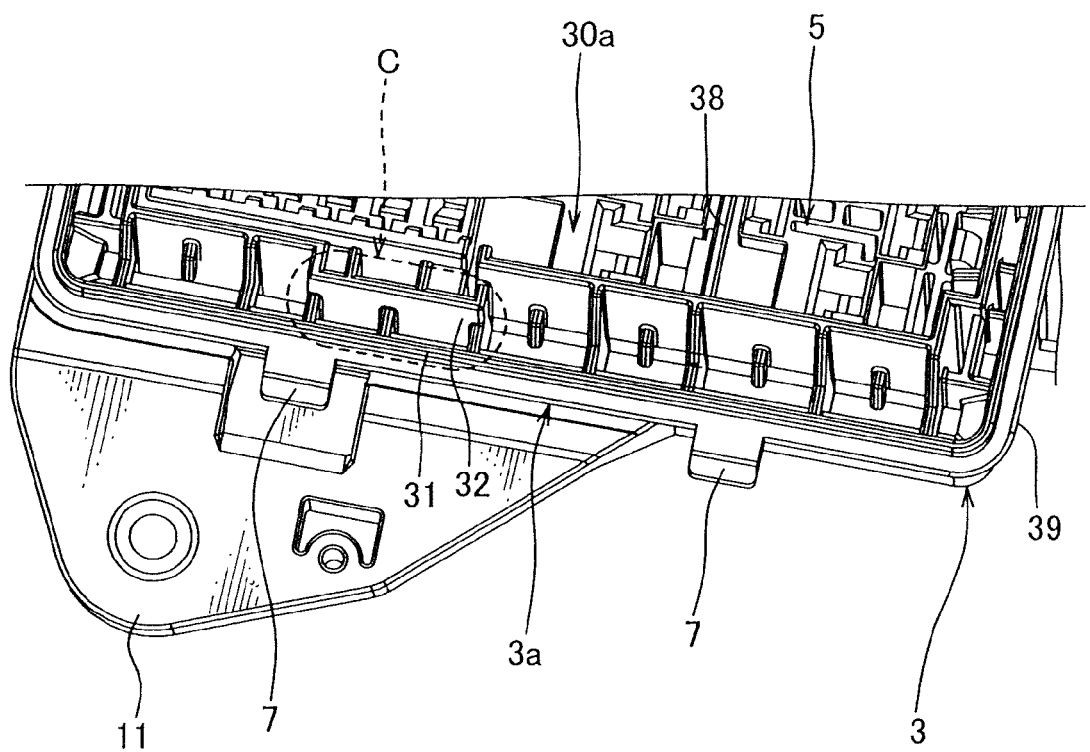
FIG. 3 is an enlarged view showing a portion of the body case shown in FIG. 2.

Furthermore, the waterproof box 1 may be provided with the aforementioned bracket 11 formed at the one end 3a of the body case 3, rising possibility of water concentrating in a circled portion C shown in FIGS. 3 and 4. Thus, in order to improve the waterproof property especially at the circled portion C located between the inner walls 22 and 32, the present invention is arranged such that a portion of the inner wall 22 of the upper cover 2 located in the circled portion C is formed close to the inner wall 32 of the body case 3 in an overlapped fashion. In this exemplary embodiment, as shown in FIG. 3, a portion of the inner wall 32 of the body case 3 located in the circled portion C is arranged closer to the outer wall 31 compared to the other portion, while the upper cover 2 has a flat shape.

Furthermore, in the present invention, at least a portion of the inner wall 22 of the upper cover 2 may be formed in contact with the inner wall 32 of the body case 3 in an overlapped fashion. As used herein, the expression "close to" and variation thereof means that the inner wall 22 and the inner wall 32 are arranged with a small space between each other, wherein the expression of "small space" is defined by a space smaller than the thickness of the inner wall 22, 32. A skilled person in the art may suitably select whether to arrange the inner wall 22 to be close to or to be continuous with the inner wall 32 according to the purpose of use or desired level of waterproof property of the waterproof box 1.

Furthermore, as shown in FIG. 5, the body case 3 may be provided with a retainer wall 33 arranged so that a tip end of the peripheral wall 49 of the lower cover 4 is sandwiched and retained between the retainer wall 33 and the outer wall 31. This retainer wall 33 may extend from the inner surface of the outer wall 31 towards the lower cover 4. Furthermore, the retainer wall 33 may include a slant face 35 extending from the upper cover 2 towards the lower cover 4 as the slant face 35 approaches from the outer wall 31 towards the inner wall 32. A bottom end of the outer wall 31 of the body case 3 is arranged to abut on the protrusion 48 formed on the lower cover 4.

Figure 7:
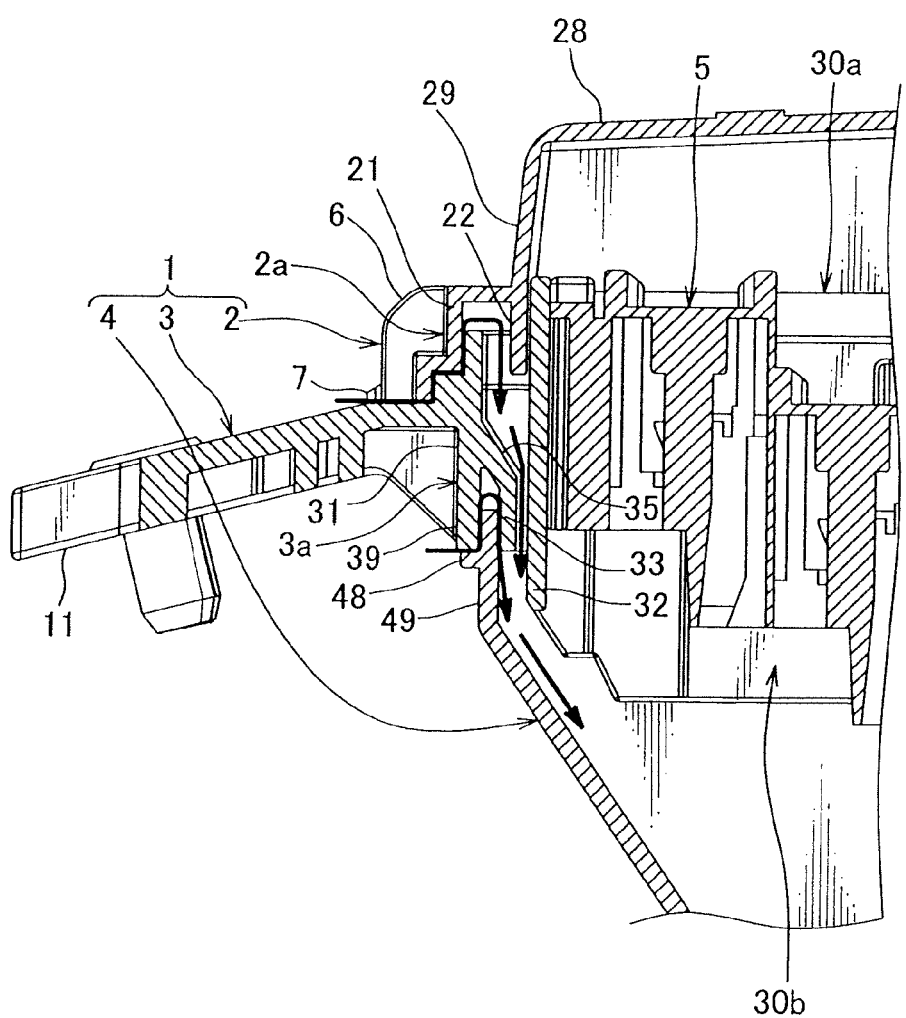
FIG. 7 is an explanatory view showing a waterproof structure of the waterproof box shown in FIG. 5.

The following will explain water entry pathway in the waterproof box 1 in reference with FIG. 7. In FIG. 7, indicated arrows show a water flow direction. The waterproof box 1 is structured to prevent water from entering into the waterproof box 1 by the stepped shape formed at both of the tip end of the outer wall 21 of the upper cover 2 and the upper end of the outer wall 31 of the body case 3; however, even if, by any chance, water has entered through a space between the outer walls 21 and 31, the water is directed to flow through a space between the outer wall 31 and the inner wall 22 provided ahead and smoothly discharged towards the lower cover 4. Moreover, even if water forcefully flows through a space between the outer wall 31 and the inner wall 22, the slant face 35 formed on the retainer wall 33 can prevent the water from plashing towards the upper cover 2, i.e. towards right above. Thus, the water flows between the retainer wall 33 and the inner wall 32 and discharged towards the lower cover 4. The water which is discharged towards the lower cover 4 is then discharged out of the waterproof box 1 through a drainage hole (not shown). Moreover, the waterproof box 1 is structured to prevent water from entering into the waterproof box 1 by the protrusion 48 formed on the lower cover 4 and by the retainer wall 33 formed on the body case 3; however, even if, by any chance, water has entered through a space between the outer wall 31 and the peripheral wall 49 and through a space between the retainer wall 33 and the peripheral wall 49, the water is directed to flow between the peripheral wall 49 and the inner wall 32 and discharged out of the waterproof box 1 through the drainage hole of the lower cover 4.

As described above, the present invention can improve waterproof performance without using a packing, thereby providing the electrical junction box 10 at low cost.

Second Exemplary Embodiment

Figure 8:
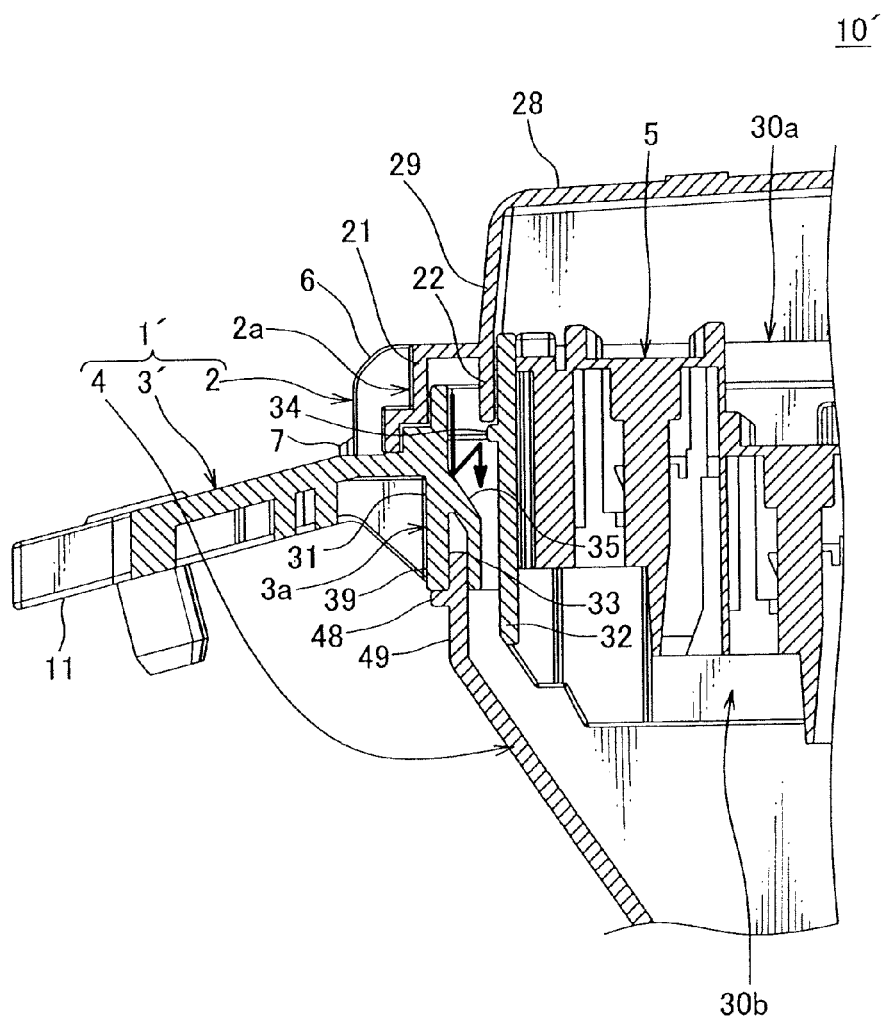
FIG. 8 is a cross-sectional view of an electrical junction box having a waterproof box according to a second exemplary embodiment of the present invention.
Figure 9:
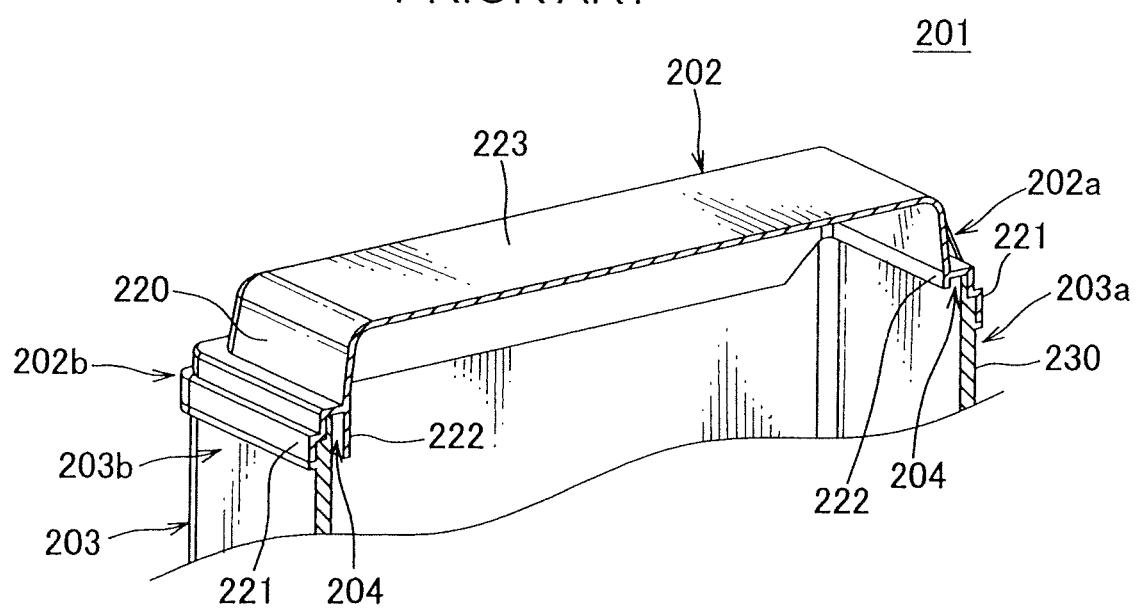
FIG. 9 is a cross-sectional perspective view showing a conventional waterproof box used in a conventional electrical junction box.

The following will explain an electrical junction box having a waterproof box according to a second exemplary embodiment of the present invention in reference with FIG. 8. In FIG. 8, the same element as the first exemplary embodiment described above is indicated by the same reference sign to eliminate explanation.

As shown in FIG. 8, an electrical junction box 10' according to this exemplary embodiment may include a waterproof case 1' having a protrusion 34 formed on an inner wall 32 of a body case 3' and on which a tip end of an inner wall 22 of an upper cover 2 abuts. The structure of the waterproof box 1' is identical to that of the above-described waterproof box 1 except that the protrusion 34 is added.

According to the waterproof case 1', even if water, which has passed through a space between an outer wall 31 of the body case 3' and the inner wall 22 of the upper cover 2, is impinged on a slant face 35 of a retainer wall 33 of the body case 3' and splattered towards the inner walls 22, 32, i.e. towards obliquely upward, the protrusion 34 which is arranged to block an entrance between the inner walls 22 and 32 can prevent the splattered water from entering into a space between the inner walls 22 and 32. Consequently, the electronic components can be protected from being affected by the water.

According to the first and second exemplary embodiments described herein, the waterproof box is utilized in the electrical junction box; however, the waterproof box according to the present invention may also be utilized in a device other than the electrical junction box.

The exemplary embodiments described herein are only representative embodiments of the present invention and are not intended to limit the present invention. That is, the shown embodiments can be modified or changed in various ways without departing from the spirit and scope of the present invention.

REFERENCE SIGNS LIST 1, 1' waterproof box
2 upper cover (cover)
3, 3' body case
6 hook portion (engagement portion)
7 projection (engagement mating portion)
10, 10' electrical junction box
21, 31 outer wall
22, 32 inner wall
30a opening
34 protrusion

The invention claimed is:

1. A waterproof box comprising,
a body case and
a cover mounted to the body case so as to cover an opening of the body case, wherein the cover is mounted to the body case by firstly making an engagement portion located at one end of the cover engaged with an engagement mating portion located at one end of the body case and then rotatably moving the cover around the engagement portion so that the cover is mounted to the body case,
wherein each of the one end of the body case and the one end of the cover has a double-walled structure composed of an outer wall and an inner wall, and
wherein with the cover mounted to the body case, the outer wall of the body case is located on an inner side of the outer wall of the cover, the inner wall of the cover is located on an inner side of the outer wall of the body case, the inner wall of the body case is located on an inner side of the inner wall of the cover, and the outer wall of the body case and the inner wall of the cover are arranged with a space between each other.

2. The waterproof box according to claim 1, further comprising a protrusion formed on the inner wall of the body case, the protrusion being arranged such that a tip end of the inner wall of the cover abuts on the protrusion.

3. The waterproof box according to claim 1, wherein at least a portion of the inner wall of the cover is arranged in contact with or adjacent to the inner wall of the body case in an overlapped fashion.

4. The waterproof box according to claim 2, wherein at least a portion of the inner wall of the cover is arranged in contact with or adjacent to the inner wall of the body case in an overlapped fashion.

5. An electrical junction box comprising the waterproof box according claim 1.

6. An electrical junction box comprising the waterproof box according claim 2.

7. An electrical junction box comprising the waterproof box according claim 3.

8. An electrical junction box comprising the waterproof box according claim 4.

* * * * *